(12) United States Patent
Ichikawa et al.

(10) Patent No.: US 8,889,443 B2
(45) Date of Patent: Nov. 18, 2014

(54) METHOD OF FORMING LIGHT CONVERTING LAYER, METHOD OF MANUFACTURING LIGHT CONVERTING MEMBER, AND METHOD OF MANUFACTURING LIGHT EMITTING DEVICE

(75) Inventors: Masatsugu Ichikawa, Tokushima (JP); Masahiko Sano, Anan (JP)

(73) Assignee: Nichia Corporation, Anan-shi (JP)

( * ) Notice: Subject to any disclaimer, the term of this patent is extended or adjusted under 35 U.S.C. 154(b) by 129 days.

(21) Appl. No.: 13/810,942

(22) PCT Filed: Jul. 21, 2011

(86) PCT No.: PCT/JP2011/066544
§ 371 (c)(1),
(2), (4) Date: Jan. 18, 2013

(87) PCT Pub. No.: WO2012/011522
PCT Pub. Date: Jan. 26, 2012

(65) Prior Publication Data
US 2013/0122620 A1   May 16, 2013

(30) Foreign Application Priority Data

Jul. 22, 2010 (JP) ................................ 2010-164410
Apr. 28, 2011 (JP) ................................ 2011-101301

(51) Int. Cl.
| | |
|---|---|
| *H01L 33/50* | (2010.01) |
| *C03C 17/00* | (2006.01) |
| *C09K 11/08* | (2006.01) |
| *C09K 11/02* | (2006.01) |
| *C03C 17/34* | (2006.01) |

(52) U.S. Cl.
CPC .......... *H01L 33/502* (2013.01); *C03C 2217/48* (2013.01); *C03C 17/007* (2013.01); *C09K 11/08* (2013.01); *C09K 11/02* (2013.01); *H01L 2933/0041* (2013.01); *C03C 17/34* (2013.01)
USPC ........................................................... 438/29

(58) Field of Classification Search
None
See application file for complete search history.

(56) References Cited

U.S. PATENT DOCUMENTS

| 4,990,371 A | 2/1991 | Dutta et al. |
| 5,601,468 A | 2/1997 | Fujii et al. |

(Continued)

FOREIGN PATENT DOCUMENTS

| JP | 50-216 | 1/1975 |
| JP | 50-29277 | 3/1975 |

(Continued)

OTHER PUBLICATIONS

Levy et al., The Preparation of Phosphor Screens for Color Television Tubes, Journal of the Electrochemical Society, vol. 101, No. 2, Feb. 1954, pp. 99-103.

(Continued)

*Primary Examiner* — Seahvosh Nikmanesh
(74) *Attorney, Agent, or Firm* — Antonelli, Terry, Stout & Kraus, LLP.

(57) ABSTRACT

Provided Is a method of forming a light converting layer capable of uniformly distributing fluorescent material particles, a method of manufacturing a light converting member capable of distributing fluorescent material particles, and a method of manufacturing a light emitting device capable of controlling color irregularities. The method of forming a light converting member comprising steps of, preparing fluorescent material particles, forming a bonding layer made of a resin on a base body; incorporating the fluorescent material particles in the bonding layer; and hardening the bonding layer.

22 Claims, 2 Drawing Sheets

(56) References Cited

U.S. PATENT DOCUMENTS

| | | |
|---|---|---|
| 5,703,433 A | 12/1997 | Fujii et al. |
| 6,982,522 B2 | 1/2006 | Omoto |
| 7,679,097 B2 | 3/2010 | Akaishi |
| 2011/0000827 A1 | 1/2011 | Minami |

FOREIGN PATENT DOCUMENTS

| | | |
|---|---|---|
| JP | 5-144375 | 6/1993 |
| JP | 5-504600 | 7/1993 |
| JP | 2003-258308 | 9/2003 |
| JP | 2004-128393 | 4/2004 |
| JP | 2007-242624 A | 9/2007 |
| JP | 2009-183886 | 8/2009 |
| JP | 2010-006850 | 1/2010 |

OTHER PUBLICATIONS

Tomita et al., Methods of Phosphor Synthesis and Related technology, Phosphor Handbook, Chapter 4, pp. 337-341.

International Preliminary Report on Patentability of Appln. No. PCT/JP2011/066544 dated Feb. 21, 2013 with English translation.

METHOD OF FORMING LIGHT CONVERTING LAYER, METHOD OF MANUFACTURING LIGHT CONVERTING MEMBER, AND METHOD OF MANUFACTURING LIGHT EMITTING DEVICE

BACKGROUND OF THE INVENTION

1. Technical Field

The present invention relates to a method of fabricating a light converting layer having fluorescent material particles, a method of manufacturing a light converting member, and a method of manufacturing a light emitting device.

2. Description of Background Art

A light emitting device has been studied that is capable of emitting light which is a mixture of light from a light emitting element and light from a light converting member having fluorescent particles which are capable of being excited by the light from the light emitting element and emitting light. As for a method of fabricating a light converting member, for example, a method in which glass powder and fluorescent material particles are mixed and then sintered (see Patent Literature 1: JP 2003-258308A) and a method in which fluorescent material particles are mixed in a resin and the mixture is applied on a light emitting element, then the resin is cured (see Patent Literature 2: JP 2004-128393A) are known.

Patent Literature 1: JP 2003-258308A
Patent Literature 2: JP 2004-128393A

DISCLOSURE OF INVENTION

Problem to be Solved by the Invention

However, in a method employing glass powder, the glass powder and the fluorescent material particles are mixed with a greater amount of glass powder than that of the fluorescent material particles so that glass powder to adhere with each other after sintering. In a method employing a resin, the fluorescent material powder and the resin are mixed so that a greater amount of resin compared to that of the fluorescent material particles is used to maintain an appropriate flowability. That is, in a conventional method, a smaller amount of fluorescent material particles is used compared to that of the glass powder or a resin which serves as a binder, so that an even distribution of the fluorescent material particles in a thickness direction and a lateral direction along the surface was difficult to obtain, which may result in occurrence of color irregularity.

In view of the above problems, the present invention is to provide a method of forming a light converting layer capable of evenly distributing fluorescent material particles in the layer and a method of manufacturing a light converting member capable of distributing fluorescent material particles in the member. Also, the present invention is to provide a method of manufacturing a light emitting device having little color irregularity.

Means to Solve the Problems

The method of forming a light converting layer according the present invention includes steps of, preparing fluorescent material particles, forming a bonding layer made of a resin on a base body; incorporating the fluorescent material particles in the bonding layer, and hardening the bonding layer.

In the method of manufacturing a light converting member according to the present invention, the base body is a substrate and the method includes a step of forming a light converting layer on one main surface of the substrate by using the method of forming a light converting layer according to the present invention, and the light converting member includes the substrate and the light converting layer.

In the method of manufacturing a light converting member according to the present invention, the base body is a light emitting element and the method includes a step of forming a light converting layer on light emitting surface of the light emitting element by using the method of forming a light converting layer according to the present invention, and the light emitting device includes the substrate and the light converting layer.

Effects of the Invention

The method of forming a light converting layer and a light converting member according the present invention includes steps of, preparing fluorescent material particles, forming a bonding layer made of a resin on a base body; incorporating the fluorescent material particles in the bonding layer; and hardening the bonding layer, thus enabling uniform distribution of the fluorescent material particles in the bonding layer. According to the method of manufacturing a light emitting device according to the present invention, a light emitting device which has less color unevenness can be obtained.

DETAILED DESCRIPTION OF EMBODIMENTS

Preferred embodiments of the present invention will be described below with reference to the accompanying drawings. The embodiments are intended as illustrative of a method of manufacturing a light emitting device and a light converting member to give a concrete form to technical ideas of the present invention, and the scope of the invention is not limited to those described below. The sizes, materials, shapes and the relative arrangements of the members described in examples are given as an example and not as a limitation to the scope of the invention unless specifically stated. The sizes and the positional relationships of the members in each of the drawings are occasionally shown exaggerated for ease of explanation.

Embodiment 1

Embodiment 1 of the present invention concerns a method of manufacturing a light converting member. A light converting member 100 fabricated according to the method includes a bonding layer 6 containing fluorescent material particles 4 formed on a substrate 5, and is used, for example, in a light emitting device. The substrate 5 is, for example, a substrate having a light transmissive property, and for example, made of a sapphire substrate. The following describes a process sequence for manufacturing of a light converting member according to Embodiment 1 of the present invention.

(Preparation of Fluorescent Material Particle)

Figure 1:
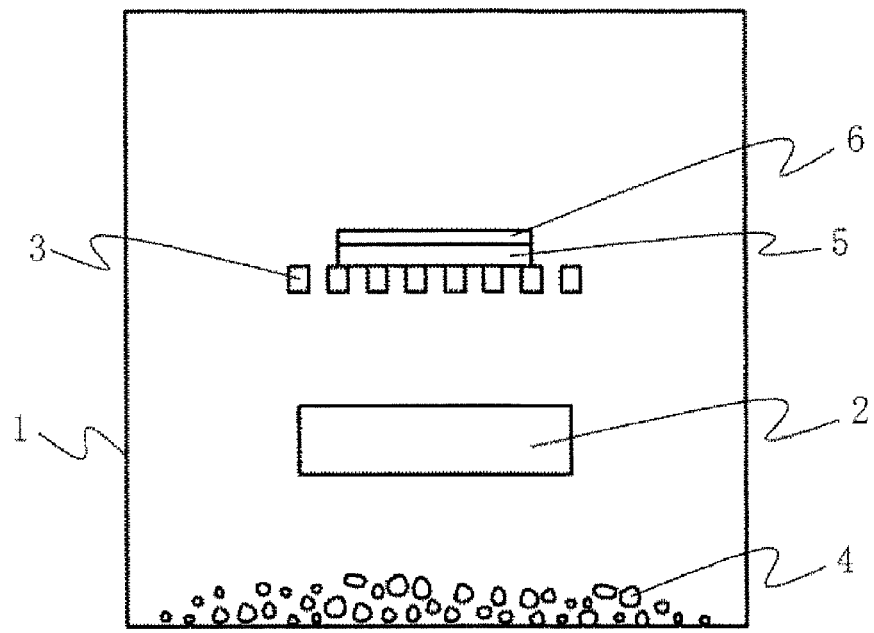
FIG. 1 is a schematic diagram for illustrating a method of manufacturing a light converting member according to an embodiment of the present invention.

Fluorescent material particles 4 are prepared as shown in FIG. 1. The fluorescent material particles 4 are needed to be capable of emitting light by light from a light emitting element 13 (see FIG. 4) which will be prepared later, and the materials of the fluorescent material particles 4 are not limited. For example, in the case where a light emitting element emits blue light, yellow light emitting fluorescent material particles such as YAG-based fluorescent material particles, TAG-based fluorescent material particles, and strontium silicate-based fluorescent material particles can be used to obtain white light emission from the light emitting device.

In the present embodiment, the fluorescent material particles 4 are arranged at the inner bottom surface of the housing 1. In the present invention, the fluorescent material particles 4 having relatively large particle sizes can be selectively bonded to the bonding layer, and thus the fluorescent material particles with diameters in a certain range can be contained in the bonding layer. But the fluorescent material particles 4 are preferably, to some extent, more uniform in particle size. The average particle size of the fluorescent material particles 4 is 0.5 μm to 50 μm, preferably 1 μm to 30 μm, more preferably 10 μm to 25 μm.

With this arrangement, the fluorescent material particles 4 can be easily circulated in the housing 1. When the light converting member is completed, the fluorescent material particles exhibit good light emitting efficiency and light extraction efficiency.

In some cases, static electricity occurs on the fluorescent material particles and makes adjacent fluorescent particles stick with each other to form agglomerates. In such cases, the static electricity occurred on the fluorescent material particles can be eliminated by the use of a known electrostatic discharger. Accordingly, the fluorescent material particles 4 can be separated into individual particles and circulation of the fluorescent material particles can be achieved with good repeatability.

In the embodiment, particles of one kind of fluorescent material are prepared, but particles of two or more kinds of fluorescent materials may be prepared.

(Formation of Bonding Layer)

Next, a bonding layer 6 is prepared. In the embodiment, a bonding layer 6 is formed on a substrate 5. The bonding layer 6 is made of a resin capable of incorporating fluorescent material particles 4 during the step of bonding fluorescent material particles (i.e. capable of containing fluorescent material particles 4) while capable of curing during the step of curing the bonding layer, and the material of the bonding member is not limited. For the material of the bonding layer 6, for example, a thermosetting resin such as a silicone resin, an epoxy resin, or the like can be used. For the technique of forming the bonding layer 6, potting, spraying, spin-coating, etc., can be used. The viscosity of the resin at the time of applying is set so as to facilitate incorporation of the fluorescent material powder 4, and is preferably 5000 cp or less, more preferably 1000 cp or less, and more preferably 100 cp or less. For the lower limit of the viscosity of the resin, for example, a viscosity equal or greater than the viscosity of water is sufficient.

The substrate 5 is needed to allow formation of the bonding layer 6 on its upper surface, and the material thereof is not limited. For the substrate 5, for example, glass or sapphire can be used.

The bonding layer 6 prior to containing the fluorescent material particles has a thickness of 3 μm or greater and less than 100 μm, preferably 5 μm or greater and less than 70 μm, more preferably 10 μm or greater and less than 50 μm.

Figure 2:
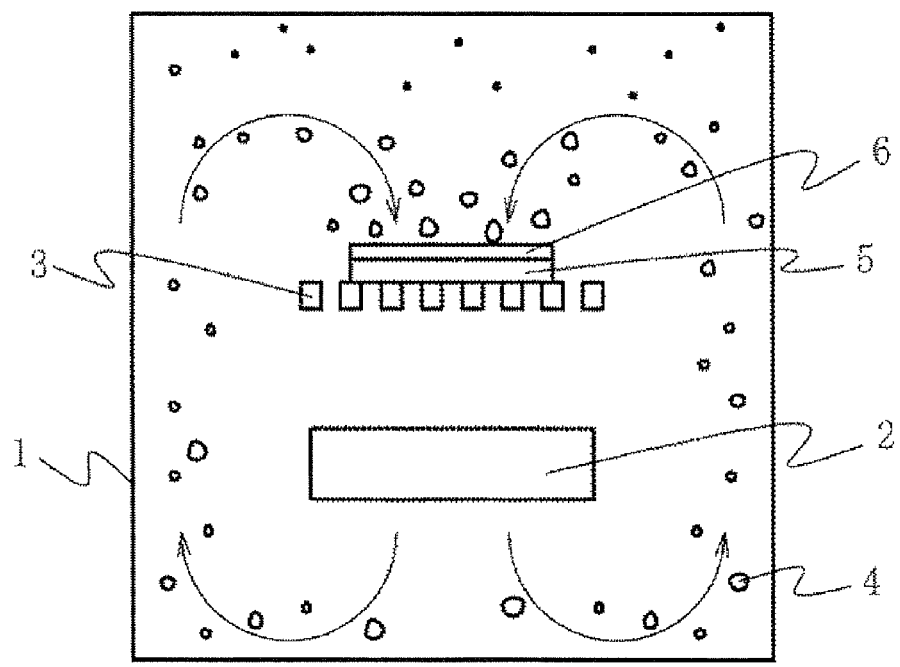
FIG. 2 is an another schematic diagram for illustrating a method of manufacturing a light converting member according to an embodiment of the present invention.

In the present embodiment, the substrate 5 is disposed on a support pedestal 3. As shown in FIG. 1 and FIG. 2, the support pedestal 3 is preferably provided with a through hole penetrating in its up-down direction. This is because, in the step of bonding the fluorescent material powder which is to be described later, the fluorescent material powder 4 carried over the bonding layer 6 is again carried downward through the through hole, so that the fluorescent material powder 4 can be used effectively.

(Bonding of Fluorescent Material Particles)

Next, the fluorescent material particles 4 are circulated over the bonding layer 6 so that the fluorescent material particles 4 are bonded to the bonding layer 6 (i.e. the fluorescent material particles 4 are incorporated (filled) in the bonding layer 6 by the wettability with the bonding layer 6 and/or by the self-weight). In the present specification, the term circulate the fluorescent material particles refers to carry the fluorescent material particles 4 by wind in the opposite directions (in an up-down direction in FIG. 1).

The technique for circulating the fluorescent material particles 4 is not limited, and for example, the fluorescent material particles 4 can be blown up from below the bonding layer 6 so that the fluorescent material particles 4 can be circulated over the bonding layer 6. Hereinafter, embodiments will be described in detail.

In the present embodiment, a blower portion 2 is arranged in the housing 1 at a position which is lower than the support pedestal 3 and is spaced apart from the side surfaces of the housing 1. The blower portion 2 is capable of blowing air downward (i.e. toward the bottom surface of the housing 1) to produce flow of air as shown in FIG. 2.

That is, air is blown downwardly from the blower portion 2 (step 1), the air is then directed outward from the bottom surface of the housing 1 (step 2), the air is then blown upward along the side surfaces of the housing 1 (step 3), and the air is then directed inward from the top surface of the housing 1 (step 4) and blown down again. The steps 1 to 4 are repeated so that the air from the blower portion 2 is circulated in the housing 1. The fluorescent material particles 4 are disposed at the bottom surface of the housing 1 so that the fluorescent material particles 4 are carried by the flow of air from the blower portion 2 to circulate in the housing 1. Although a planar image at a cross-section of the housing is shown in FIG. 2, in reality, the air blown from the blower portion 2 swirls the fluorescent material particles 4 at the bottom surface of the housing 1 and moves in radial directions toward the side surfaces and rises up along all the side surfaces. Then, at the upper surface of the housing 1, the flow of the air is again directed toward the center of the housing and thus is circulated. In view of the flow of air as described above, the housing 1 preferably has a cylindrical side surface to obtain stable flow of air in the housing, and the blower 2 is preferably disposed in the housing so that the center of the air blown out from the blower 2 is in conformity with the central axis of the cylindrical side surface of the housing 1. Also, the operation of the blower 2 is preferably such that the fluorescent material particles 4 falling down from upper portions and passing through the blower 2 are not damaged.

In this step, of the fluorescent material particles 4 having various particle sizes, the fluorescent material particles 4 having a large particle sizes to a certain degree (i.e. large particle size) circulate in the housing 1 more preferentially than the fluorescent material particles 4 having smaller diameters (i.e. small particle size) and bonded to the bonding layer 6. Although the reason is not clear, it is considered that even if the fluorescent material particles of small particle sizes which are blown up by the flow of air tend to accumulate at the corners or the like of the housing 1 due to their small particle sizes and light weights and do not reach the bonding layer 6. Further, generally, the smaller the particle sizes of the fluorescent material particles, the larger the adhesion power (agglomerating power), so that the fluorescent material particles having small particle size; are not easily blown upward (this is thought that the fluorescent material particles having smaller particle sizes have a large surface area with respect to a unit of weight and moisture tends to be absorbed on their surfaces). Thus, improvement in the light emitting efficiency can be expected with the light converting layer according to the present embodiment which is capable of preferentially incorporating fluorescent material particles 4 of large particle diameters into the bonding layer 6.

Generally, it is said that the fluorescent material particles of large particle sizes are more preferable than of small particle sizes for a light converting member. For example, suppose a case in which fluorescent material particles of small particle sizes and large particle sizes are respectively accumulated to pre-determined thickness. In this case, the number of fluorescent material particles in the thickness direction is greater with the fluorescent material particles of small particle sizes than that of the fluorescent material particles of large particle sizes, which leads an increase in the amount of light reflection at the surfaces (interfaces) of the fluorescent material particles and may result in a decrease of the light extracting efficiency in the thickness direction. On the other hand, with the fluorescent material particles of large particle sizes, a smaller number of fluorescent material particles is disposed in the thickness direction compared to that of the fluorescent material particles of smaller particle sizes, which reduces the number of light reflection at the surfaces of the fluorescent material particles and thus the light extracting efficiency in the thickness direction can be improved. Further, crystal structures at the surfaces of fluorescent material particles are distorted, so that it is considered that efficient emission at the surfaces of fluorescent material particles cannot be obtained. As described above, light emitting efficiency of fluorescent material particles of small particle sizes decreases due to a large surface area with respect to a unit of weight. On the other hand, fluorescent material particles of large particle sizes have a smaller surface area with respect to a unit of weight (a larger volume ratio of inner side of surfaces where distortion of crystal structure is suppressed), so that efficient emission can be obtained. For these reasons, it is important in formation of the light converting member that the fluorescent material particles of smaller particle sizes are prevented from being incorporated and preferentially using fluorescent material particles of larger particle sizes.

The total amount of the fluorescent material particles incorporated in the bonding layer 6 at completion can be controlled by the thickness of the bonding layer 6. That is, the maximum amount of fluorescent material particles which can be incorporated in the bonding layer 6 (i.e. the maximum amount of fluorescent material which can be fixed to the base material by the bonding layer 6) is smaller with smaller thickness of the bonding layer 6 and greater with greater thickness of the bonding layer 6. The fluorescent material particles accumulated on the bonding layer 6 in excess of the maximum amount with respect to the thickness are not adhered to the bonding layer 6 and thus easily removed. That is, with the use of the facts that a small thickness of the bonding layer 6 inevitably reduce the amount of the fluorescent material particles 4 incorporated in the bonding layer 6, a large thickness of the bonding layer 6 inevitably increase the amount of the fluorescent material particles 4 incorporated in the bonding layer 6, and the fluorescent material particles accumulated on the bonding layer 6 in excess of the maximum amount with respect to the thickness can be removed easily, the amount of the fluorescent material particles 4 incorporated in the bonding layer 6 can be easily controlled. In the present step of bonding fluorescent material particles, the fluorescent material particles 4 are excessively applied to the bonding layer 6 to an extent so that excessive amount of the fluorescent material particles 4 which cannot be incorporated in the bonding layer 6. In other words, in the present embodiment, the fluorescent material particles 4 are supplied with an amount larger than the amount that the bonding layer 6 in situ under a certain conditions and a predetermined thickness can contain. As a result, the bonding layer 4 formed with a relatively uniform thickness can be in a state in which the fluorescent material particles 4 are incorporated with a maximum amount throughout the layer, and thus compared to conventional techniques, more uniform distribution of the fluorescent material particles 4 in the thickness direction and a lateral direction within the bonding layer can be achieved. As a result, when used in a light emitting device, color irregularities can be further prevented.

In the above, the case where the fluorescent material particles 4 are bonded to the bonding layer 6 by circulating the fluorescent material particles is illustrated, but the fluorescent material particles 4 can be simply bonded to the bonding layer 6 without circulating the fluorescent material particles. For example, the fluorescent material particles 4 can be contained in the bonding layer 6 by simply spreading the fluorescent material particles from above the bonding layer 6. In this case, the fluorescent material particles 4 of small particle sizes can not be intentionally eliminated, but it is needless to say that the effect of preventing color irregularities can be achieved in a similar manner.

(Curing of Bonding Layer)

Next, a bonding layer 6 is hardened. For example, in a conventional technique using a resin, a resin which serves as a binder and fluorescent material particles are mixed and applied to another member such as a light emitting element, and then hardened, but according to the present embodiment, the fluorescent material particles are bonded to the bonding layer 6 and then hardened without a need of mixing of the both. Thus, a light converting member can be formed with simplified steps. The technique used for hardening is not limited, but in the case where the bonding layer 6 is made of a thermosetting resin, heating the bonding layer 6 allows hardening of the bonding layer 6 integrally with the fluorescent material particles 4 that the bonding layer incorporates, thus forming a light converting layer 10 made up of the substrate 5, the bonding layer 6 and the fluorescent material particles 4.

The excess amount of the fluorescent material particles accumulated on the bonding layer 6 without being incorporated in the bonding layer 6 can be removed by, for example, washing after the step of hardening bonding layer.

Figure 3:
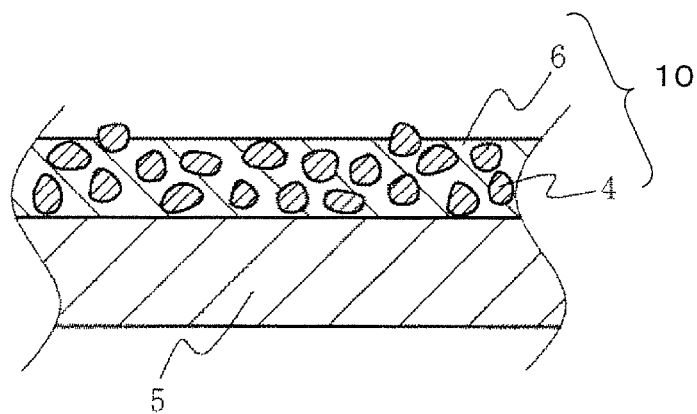
FIG. 3 is an enlarged cross-sectional view in the vicinity of a bonding layer.

FIG. 3 shows a magnified schematic view near the bonding layer obtained in the present step. In the present specification, the bonding layer 6 that contains fluorescent material particles and is hardened is referred to as the light converting layer 10. As shown in FIG. 3, in the light converting layer 10, a part of fluorescent material particles 4 are exposed from the surface of the bonding layer 6. This is considered that the fluorescent material particles 4 which are accumulated earlier are already incorporated in the bonding layer 6, and the fluorescent material particles 4 which are accumulated later are not completely incorporated in the bonding layer 6. In the present embodiment, the bonding layer 6 is arranged as the top layer, but for example, in order to make the surface of the bonding layer 6 smooth, a light transmissive layer which does not contain fluorescent material particles may further be formed on the bonding layer 6.

In view of working efficiency, the light converting member having a relatively large area (for example, a wafer) is preferably formed. Further, when a conventional technique is used, deviation in the distribution of fluorescent material particles tends to occur as the area increases, but with a technique according to the present embodiment, occurrence of deviation in the distribution of fluorescent material can be prevented relatively easily even in the case of a large area. This is because distribution of fluorescent material particles can be controlled simply by making the thickness of the bonding layer 6 uniform.

Further, recovery efficiency of the fluorescent material particles 4 according to the present embodiment is higher than that to conventional techniques. This is because the fluorescent material particles 4 which are not incorporated in the bonding layer 6 can be reused, so that in theory, a waste in the fluorescent material particles 4 is not generated.

Embodiment 2

Figure 4:
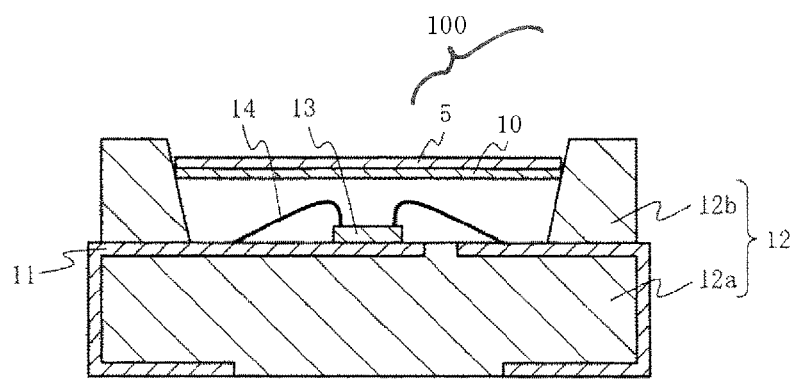
FIG. 4 is a schematic cross-sectional view of a light emitting device according to an embodiment of the present invention.

A light emitting device according to Embodiment 2 of the present invention is constituted by including a light converting member obtained in Embodiment 1 and a light emitting element. As shown in FIG. 4, with combining the light converting member 100 obtained in Embodiment 1 and a light emitting element 13, a light emitting device capable of mixing light from the light emitting element 13 and light from the light converting member can be obtained (step of forming light emitting device).

More specifically, a light emitting device according to the present embodiment includes a package 12 made of a base 12a and side surfaces 12b, a pair of lead frames 11 respectively disposed along the periphery of the package 12, a light emitting element 13 disposed on one of the lead frames exposed at the bottom surface of a recess defined by the side surfaces 12b, wires 14 electrically connecting each of the electrodes (not shown) of the light emitting element to each of the corresponding lead frames, and a light converting member 100 made of a substrate 5 and a bonding layer 6 (containing fluorescent material particles 4) disposed above the recess defined by the side surfaces 12b. In this embodiment, the substrate 5 is arranged outside and the bonding layer 6 is arranged inside so that the substrate 5 is at the viewing side. The light converting member 100 can be bonded to the side surfaces 12b of the package through an adhesive material made of a silicone resin etc.

For the light emitting element 13, a known light emitting element can be used and, for example, an LED made of a GaN-based semiconductor ($In_XAl_YGa_{1-X-Y}N$, $0 \leq X$, $0 \leq Y$, $X+Y \leq 1$) capable of emitting blue light or green light can be used.

In Embodiment 2, the substrate 5 is used as it is as the light converting member 100, but the substrate 5 may be made thinner or removed as needed. For example, in the case where the bonding layer 6 is formed on the substrate 5 by way of spin coating, the substrate 5 needs to have a certain degree of thickness in the step of forming bonding layer. However, in the step of forming a light emitting device, the thickness of the substrate 5 may become an obstacle to the operation, and in such a case, the substrate 5 is preferably reduced in thickness or removed.

Embodiment 3

A light emitting device according to Embodiment 3 includes a light converting member formed integral to the light emitting element by forming the bonding layer 6 directly on the light emitting element 13. Similar technique as in Embodiment 1 is used for incorporating the fluorescent material particles 4 in the bonding layer 6. That is, the bonding layer 6 and not the substrate 5 is directly formed on the light emitting element 13 (step of forming binding layer), and the fluorescent material particles 4 are bonded to the bonding layer 6 to form a light emitting device.

Figure 5:
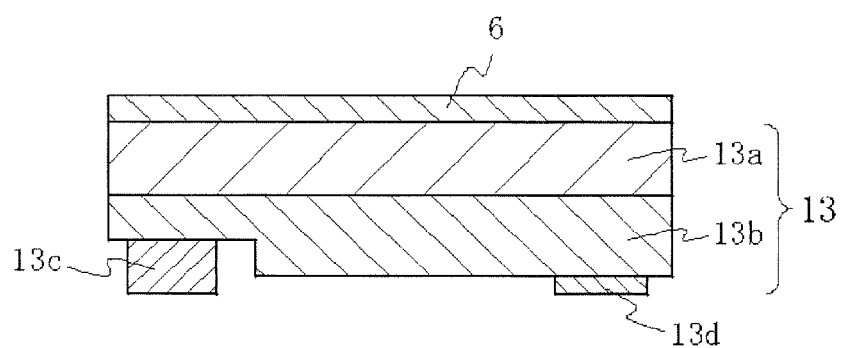
FIG. 5 is a schematic cross-sectional view of a light emitting device according to an another embodiment of the present invention.

For example, as shown in FIG. 5, in the case where a pair of electrodes 13c and 13d are disposed on one of the main surfaces of a light emitting element 13 having a pair of opposing main surfaces, a light converting layer made of the bonding layer which contains the fluorescent material particles can be disposed on the one main surface and the opposing the other main surface of the light emitting element 13. The light emitting device shown in FIG. 5 can be mounted, for example, on an electrically conductive member such as a lead frame with one of the main surfaces facing down (face-down mounting).

In the present embodiment, the light emitting element 13 has a structure made of a growth substrate 13a, a semiconductor portion 13b, and an n-electrode 13c and a p-electrode 13d, but it is needless to say that the structure of the light emitting element 13 in not limited to this. For example, in the case where the n-electrode is disposed on one of the main surfaces of the light emitting element having a pair of opposing main surfaces and the p-electrode is disposed on the other main surface, the light converting layer can be disposed on one of the main surfaces at a region other than the electrode.

In the case where the bonding layer 6 is formed on the light emitting element, in view of working efficiency, the light emitting element is preferably in a wafer state. In such a case, dividing the wafer after the step of hardening the bonding layer allows obtaining individual light emitting elements.

Embodiment 4

Through Embodiments 1 to 3, further performing a step described below after the step of hardening bonding layer allows formation of a light converting member having a plurality of bonding layers (not shown).

Firstly, second fluorescent material particles which are different from the fluorescent material particles 4 (first fluorescent material particles) are prepared (step of preparing second fluorescent material particles). Next, a second bonding layer is formed on an upper surface of the bonding layer 6 (first bonding layer) which is hardened in Embodiment 1 (step of forming second bonding layer). Next, the second fluorescent material particles are circulated above the second bonding layer to bond the second fluorescent material particles to the second bonding layer (step of bonding second fluorescent material particles). Next, the second bonding layer is hardened (step of hardening second bonding layer).

That is, repeating the step of preparing fluorescent material particles, the step of forming bonding layer, the step of bonding fluorescent material particles, and the step of hardening bonding layer for a plurality of times allows formation of a light converting member in which a first bonding layer containing the first fluorescent material particles and a second bonding layer containing the second fluorescent material particles are stacked. Particularly, in the present embodiment, the first fluorescent material particles can be incorporated to the top surface of the first bonding layer, so that in the first bonding layer and the second bonding layer, the first fluorescent material particles and the second fluorescent material particles can be disposed substantially continuously. With this arrangement, gaps between the first fluorescent material particles and the second fluorescent material particles are substantially eliminated, and thus the light extraction efficiency can be improved.

In the case where a plurality of bonding layers are disposed on the light converting member, in order from the light emitting element side, the bonding layer (first bonding layer) containing fluorescent material particles (first fluorescent material particles) capable of emitting light of a long wavelength, and the bonding layer (second bonding layer) containing fluorescent material particles (second fluorescent material particles) capable of emitting light of a short wavelength are preferably arranged. With this arrangement, multi-stage excitation can be prevented, and thus the light emitting efficiency can be improved. For example, emission of second fluorescent material by the emission of the first fluorescent material particles can be prevented by employing red light fluorescent material particles for the first fluorescent material particles and yellow light fluorescent material particles for the second fluorescent material particles.

The housing, the blower and the support pedestal of similar kinds as in Embodiment 1 can be used. The principle is similar to Embodiment 1 and description thereof will be omitted.

Embodiment 5

A light converting member is formed in a similar manner as in the step of forming bonding layer in Embodiment 1, except that the bonding layer is formed on a predetermined region of the substrate. Forming the bonding layer selectively on the substrate allows easy patterning of the light converting member.

Embodiment 6

A light emitting device is formed in a similar manner as in the step of forming bonding layer in Embodiment 3, except that the bonding layer is formed selectively on a surface of the light emitting element. With this arrangement, the light converting layer can be formed selectively on the light emitting surface of the light emitting element.

INDUSTRIAL APPLICABILITY

The method of manufacturing the light converting member and the light emitting device according to the present invention can be applied to manufacturing various kinds of light sources such as illumination light sources, light sources for various kinds of indicators, light sources for automobile use, light sources for displays, back light sources for liquid crystal displays, light sources for sensors, signals, and so on.

DENOTATION OF NUMERALS

1: housing
2: blower portion
3: support pedestal
4: fluorescent material particles
5: substrate
6: bonding layer
10: light converting layer
11: lead frame
12: package
13: light emitting element
14: wire
100: light converting member

The invention claimed is:

1. A method of forming a light converting layer for a light emitting device comprising steps of:
preparing fluorescent material particles;
forming a bonding layer made of a resin on a base body;
incorporating the fluorescent material particles in the bonding layer; and
hardening the bonding layer.

2. The method of forming a light converting layer according to claim 1, wherein in the step of incorporating the fluorescent material particles in the bonding layer, a maximum amount of fluorescent material particles is incorporated in the bonding layer.

3. The method of forming a light converting layer according to claim 2 further comprising, after the step of incorporating the fluorescent material particles in the bonding layer, a step of removing an excess amount of fluorescent material particles which are adhered on the bonding layer without being incorporated in the bonding layer.

4. The method of forming a light converting layer according to claim 1, wherein in the step of incorporating the fluorescent material particles in the bonding layer, the fluorescent material particles prepared in the preparing fluorescent material particles are circulated to be incorporated in the bonding layer.

5. A method of manufacturing a light converting member comprising a step of forming a light converting layer according to the method of forming a light converting layer according to claim 1 in which the base body is a substrate, on one main surface of a substrate to obtain a light converting member comprising the substrate and the light converting layer.

6. The method of manufacturing a light converting member according to claim 5 comprising a step of removing the substrate after forming the light converting layer to obtain a light converting member comprising the light converting layer.

7. A method of manufacturing a light emitting device comprising steps of:
forming a light converting member according to the method of manufacturing a light converting member according to claim 5;
providing a light emitting element; and
combining the light emitting element and the light converting member to obtain a light emitting device.

8. A method of manufacturing a light emitting device comprising a step of forming a light converting layer according to the method according to claim 1, on a light emitting surface of a light emitting element, in which the base body is the light emitting element, to form a light emitting device having the substrate and the light converting layer.

9. The method of manufacturing a light converting layer according to claim 1, wherein the bonding layer is made of a thermosetting resin.

10. The method of manufacturing a light converting layer according to claim 1, wherein the bonding layer is formed by spin-coating.

11. The method of manufacturing a light converting layer according to claim 1, wherein the fluorescent material particles are selected from a group consisting of YAG-based fluorescent material particles, TAG-based fluorescent material particles and strontium silicate-based fluorescent material particles.

12. The method of manufacturing a light converting layer according to claim 1, wherein the bonding layer is formed so as to have a thickness of 3 μm or greater and less than 100 μm.

13. The method of manufacturing a light converting layer according to claim 1, further comprising:
preparing second fluorescent material particles;
forming a second bonding layer made of a resin on the bonding layer formed on the base body;

incorporating the second fluorescent material particles in the second bonding layer; and hardening the second bonding layer.

14. The method of manufacturing a light converting member according to claim 5, wherein the substrate comprises a sapphire substrate.

15. The method of manufacturing a light converting member according to claim 5, wherein the bonding layer is made of a thermosetting resin.

16. The method of manufacturing a light converting member according to claim 5, wherein the bonding layer is formed by spin-coating.

17. The method of manufacturing a light converting member according to claim 5, wherein the fluorescent material particles are selected from a group consisting of YAG-based fluorescent material particles, TAG-based fluorescent material particles and strontium silicate-based fluorescent material particles.

18. The method of manufacturing a light converting member according to claim 5, wherein the bonding layer is formed so as to have a thickness of 3 μm or greater and less than 100 μm.

19. The method of manufacturing a light converting member according to claim 5, further comprising:

preparing second fluorescent material particles;

forming a second bonding layer made of a resin on the bonding layer formed on the base body;

incorporating the second fluorescent material particles in the second bonding layer; and hardening the second bonding layer.

20. The method of manufacturing a light emitting device according to claim 7, wherein the light emitting element is made of a GaN-based semiconductor represented by a formula $In_XAl_YGa_{1-X-Y}N(0 \leq X, 0 \leq Y, X+Y \leq 1)$.

21. The method of manufacturing a light converting layer according to claim 13, wherein the second fluorescent material particles are capable of emitting light of a shorter wavelength than a wavelength of light of which the fluorescent material particles incorporated in the bonding layer formed on the base body are capable of emitting.

22. The method of manufacturing a light converting member according to claim 19, wherein the second fluorescent material particles are capable of emitting light of a shorter wavelength than a wavelength of light of which the fluorescent material particles incorporated in the bonding layer formed on the base body are capable of emitting.

* * * * *